United States Patent
Sikina et al.

(10) Patent No.: US 11,145,952 B2
(45) Date of Patent: Oct. 12, 2021

(54) ADVANCED COMMUNICATIONS ARRAY

(71) Applicant: RAYTHEON COMPANY, Waltham, MA (US)

(72) Inventors: Thomas V. Sikina, Acton, MA (US); John P. Haven, Lowell, MA (US); Kevin Wilder, Derry, NH (US); James E. Benedict, Lowell, MA (US); Andrew R. Southworth, Lowell, MA (US); Mary K. Herndon, Littleton, MA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 16/683,593

(22) Filed: Nov. 14, 2019

(65) Prior Publication Data

US 2021/0151855 A1    May 20, 2021

(51) Int. Cl.
| | |
|---|---|
| *H01Q 3/34* | (2006.01) |
| *H01Q 1/24* | (2006.01) |
| *H01Q 1/52* | (2006.01) |
| *H01Q 21/00* | (2006.01) |
| *H01Q 21/06* | (2006.01) |

(52) U.S. Cl.
CPC ............. *H01Q 1/241* (2013.01); *H01Q 1/528* (2013.01); *H01Q 21/0087* (2013.01); *H01Q 21/065* (2013.01)

(58) Field of Classification Search
CPC ...................................................... H01Q 1/241
USPC ........................................................... 343/878
See application file for complete search history.

(56) References Cited

U.S. PATENT DOCUMENTS

| | | | |
|---|---|---|---|
| 10,741,914 B2* | 8/2020 | Vouvakis | .................. H01Q 5/48 |
| 2018/0045698 A1* | 2/2018 | Sultana | ................ G01N 27/127 |
| 2018/0183146 A1 | 6/2018 | Sikina et al. | |
| 2019/0101639 A1* | 4/2019 | Rincon | ................ H01Q 21/065 |
| 2019/0148828 A1 | 5/2019 | Sikina et al. | |
| 2019/0357363 A1* | 11/2019 | Sikina | ...................... H01Q 3/40 |
| 2020/0395651 A1* | 12/2020 | Wilder | ............... H01Q 21/0075 |

OTHER PUBLICATIONS

International Search Report and Written Opinion in International Patent Application No. PCT/US2020/058536 dated Feb. 2, 2021.

* cited by examiner

*Primary Examiner* — Peguy Jean Pierre
(74) *Attorney, Agent, or Firm* — Lando & Anastasi, LLP

(57) ABSTRACT

A communications array includes a support structure configured to array elements, and a plurality of array elements supported by the support structure. Each array element is fabricated from an advanced manufacturing techniques (AMT) process. The support structure may be fabricated from a printed circuit board (PCB) or similar dielectric material. Each array element may include a radiator and/or a beamformer manufactured using the AMT process. The communications array further may include a copper vertical launch (CVL) and/or an electromagnetic boundary.

13 Claims, 4 Drawing Sheets

ADVANCED COMMUNICATIONS ARRAY

GOVERNMENT RIGHTS

Not applicable.

BACKGROUND

Communications array designs currently employ a standard PCB process which relies on multiple process steps, expensive materials, and slow cycle turnaround time. Conventional PCB manufacturing process steps may include lamination, electroplating, masking, etching, and other complex process steps, and may require multiple steps, expensive and/or hazardous materials, multiple iterations, extensive labor, etc., all leading to higher cost and slower turnaround time. Additionally, conventional PCB manufacturing processes have limited ability to allow for small feature sizes, such as transmission line (e.g., stripline) dimensions, and dimensions of dielectric materials between conductors (e.g., dielectric thickness, inter-via spacing, etc.), thereby limiting the range of highest frequency signals that may be supported by such circuits. Multiple process steps are the driver for both the high-cost and slow turnaround time.

As assemblies are moved from one process to the next (lamination, conductive via backfill, etc.) labor cost is added to the overall assembly. The added labor cost adds cycle time which leads to long build times which extend any troubleshooting phase. In addition, typical PCB process does not allow for the small feature sizes necessary to produce arrays sized for millimeter wave (mmW) frequencies of 30 GHz and greater. Newly developed arrays are emerging in the 5G communications market, using the PCB limitations. A typical communications array fabricated by such prior processes is generally indicated at 10 in FIG. 1.

SUMMARY

One aspect of the disclosure is directed to a communications array comprising a support structure configured to array elements, and a plurality of array elements supported by the support structure. Each array element is fabricated from an advanced manufacturing techniques (AMT) process.

Embodiments of the communications array further may include fabricating the support structure from a printed circuit board (PCB) or similar dielectric material. Each array element of the plurality of array elements may include a radiator manufactured using the AMT process. The support structure may include a surface having an electrically conductive material disposed thereover. An aperture may have a square shape is milled into the surface of the support structure. Each array element of the plurality of array elements may include a beamformer manufactured using the AMT process. The beamformer may include multiple receptors and accordant output signal traces. The plurality of array elements may include an 8×8 array having 64 array elements. Each array element may be square-shaped, and includes a length and width of approximately 1.69 inches. Each array element may include an overall length and width of 0.210 inches, with the array element having a length and width of 0.90 inches. A process panel may be used to manufacture the communications array. The communications array further may include a copper vertical launch (CVL). The CVL may include staking a copper wire into a hole formed in the support structure. The communications array further may include an electromagnetic boundary. The electromagnetic boundary may include machining a trench through the support structure and filling the trench with a conductive material. The conductive material may include a conductive ink applied by the AMT process. A weight of the communications array may not exceed 0.7 oz. (20 g).

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures may be represented by a like numeral. For purposes of clarity, not every component may be labeled in every figure. The foregoing features may be more fully understood from the following description of the drawings in which.

DETAILED DESCRIPTION

Figure 1:
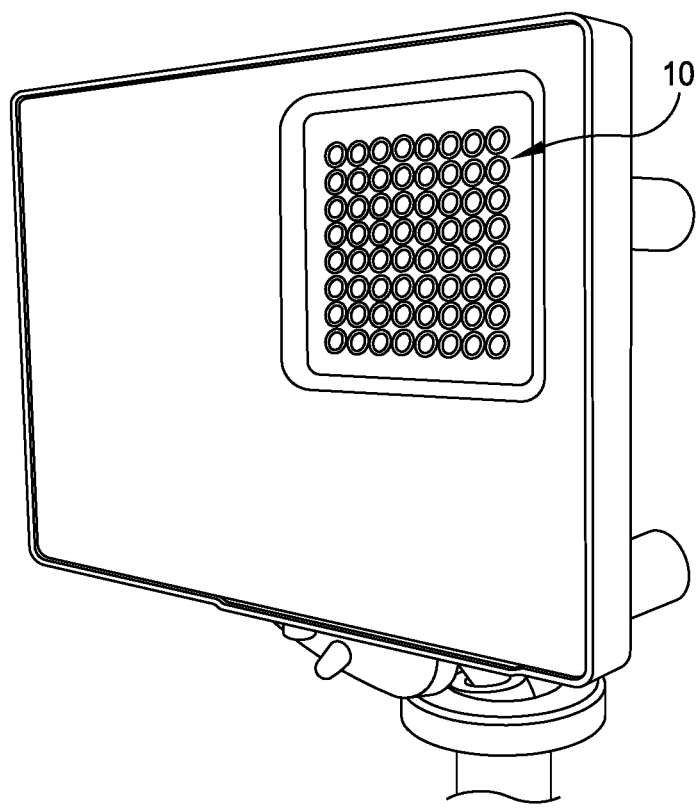
FIG. 1 is a perspective view of a device having a traditional communications array.

Aspects and examples described herein provide communications array structures that are provided within various devices, such as cell phones. The communications array structures described herein efficiently distribute signal currents while maintaining characteristic impedance and minimizing signal loss. The communications array structures described herein are suitable for various circuit board manufacturing, including radio frequency circuit embodiments, and advantageously apply subtractive and additive manufacturing techniques. Such techniques may provide structures capable of conveyance and containment of radio frequency signals in microwave and millimeter wave ranges, for example 28 GHz.

The concepts, systems and techniques described herein are directed toward a communications array structure that is fabricated by using additive manufacturing technology. Manufacturing processes described herein may be particularly suitable for fabrication of circuit structures having physically small features capable of supporting electromagnetic signals in the range of 8 to 75 GHz or more, for example, using suitable subtractive (e.g., machining, milling, drilling, cutting, stamping) and more importantly additive (e.g., filling, flowing, 3-D printing) manufacturing equipment. Electromagnetic circuit structures in accord with systems and methods described herein may be particularly suitable for application in 28 GHz systems, including millimeter wave communications, sensing, ranging, etc.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and methods or their components to any one positional or spatial orientation.

The term "radio frequency" as used herein is not intended to be limited to a particular frequency, range of frequencies, band, spectrum, etc., unless explicitly stated and/or specifically indicated by context. Similarly, the terms "radio frequency signal" and "electromagnetic signal" are used interchangeably and may refer to a signal of various suitable frequency for the propagation of information-carrying signals, for any particular implementation. Such radio frequency signals may generally be bound at the low end by frequencies in the kilohertz (kHz) range, and bound at the high end by frequencies of up to hundreds of gigahertz (GHz), and explicitly includes signals in the microwave or millimeter wave ranges. Generally, systems and methods in accord with those described herein may be suitable for handling non-ionizing radiation, at frequencies below those conventionally handled in the field of optics, e.g., of lower frequency than, e.g., infrared signals.

Various embodiments of radio frequency circuits may be designed with dimensions selected and/or nominally manufactured to operate at various frequencies. The selection of appropriate dimensions may be had from general electromagnetic principles and are not presented in detail herein.

The methods and apparatuses described herein may support smaller arrangements and dimensions than conventional processes are capable. Conventional circuit boards may be limited to frequencies below about 30 GHz. The methods and apparatuses described herein may allow or accommodate the manufacture of electromagnetic circuits of smaller dimensions, suitable for radio frequency circuits intended to be operated at higher frequencies, using safer and less complex manufacturing, at lower cost.

Electromagnetic circuits and methods of manufacture in accord with those described herein include various additive and subtractive manufacturing techniques to produce electromagnetic circuits and components capable of handling higher frequencies, with lower profiles, and at reduced costs, cycle times, and design risks, than conventional circuits and methods. Examples of techniques include machining (e.g., milling) of conductive material from a surface of a substrate to form transmission wave phased arrays, which may be of significantly smaller dimensions than allowed by conventional PCB processes, machining of one or more substrates to form a trench, using 3-dimensional printing techniques to deposit printed conductive inks into the trench to form a continuous electric barrier (e.g., a Faraday wall) (as opposed to a series of ground vias with minimum spacing therebetween), "vertical launch" signal paths formed by machining (such as milling, drilling, or punching) a hole through a portion of substrate and in which a conductor (such as a wire segment) is placed and/or conductive ink is printed, to make electrical contact to a transmission line disposed on a surface of the substrate (or an opposing substrate), and using 3-dimensional printing techniques to deposit printed resistive inks to form resistive components.

Any of the above example techniques and/or others (e.g., soldering and/or solder reflow), may be combined to make various electromagnetic components and/or circuits. Aspects and examples of such techniques are described and illustrated herein with respect to a wave phased array to contain and convey an electromagnetic signal along a layer of an electromagnetic circuit in one dimension and, optionally, vertically through to other layers of the circuit in another dimension. The techniques described herein may be used to form various electromagnetic components, connectors, circuits, assemblies, and systems.

The communications array structure of embodiments of the present disclosure utilizes advanced manufacturing techniques (AMT) to build a commercially viable phased array for the 5G communications market. Designs that can implement the AMT approach are significantly lower cost in production, can be rapidly prototyped, and customized to meet design needs. The communications array uses AMT to miniaturize component dimensions to fit into array dimensions necessary to operate at a desired frequency, e.g., 28 GHz. This pushes past the current limitations of standard photo-etch or printed circuit board (PCB) manufacturing processes.

The communications array structure disclosed herein solves problems associated with conventional PCB manufacturing processes by providing a design that uses the capabilities provided by AMT. The milling and printing capabilities of the AMT machines allow for the smaller feature sizes needed for an array operating at the desired frequencies. The dimensions can be miniaturized down to 0.002 inch for trace widths and 0.005 inch for via diameters. Printed conductive Faraday walls are used to confine electric fields and can be produced in the same manufacturing step as milling the other features. This saves significant labor costs which drive down the overall cost of the assembly. Finally, custom printed connector interfaces can be used for standard coaxial and integrated chip (IC) connections.

The communications array structure uses AMT techniques, such as Faraday walls, the copper vertical launch (CVL) connections, single-step mill and fill operations, and milled copper traces. It represents an array that is reliably manufactured using AMT to produce a cost-effective manner array. Other array designs do not have the combination of miniature feature sizes, printed conductive elements, rapid prototyping capability, and connection to standard connectors.

Figure 2:
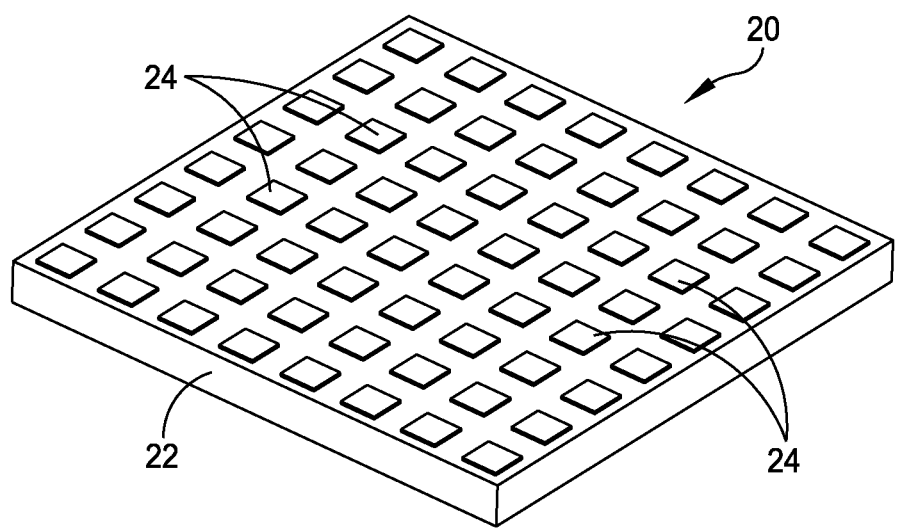
FIG. 2 is a perspective view of a communications array of an embodiment of the present disclosure.
Figure 3:
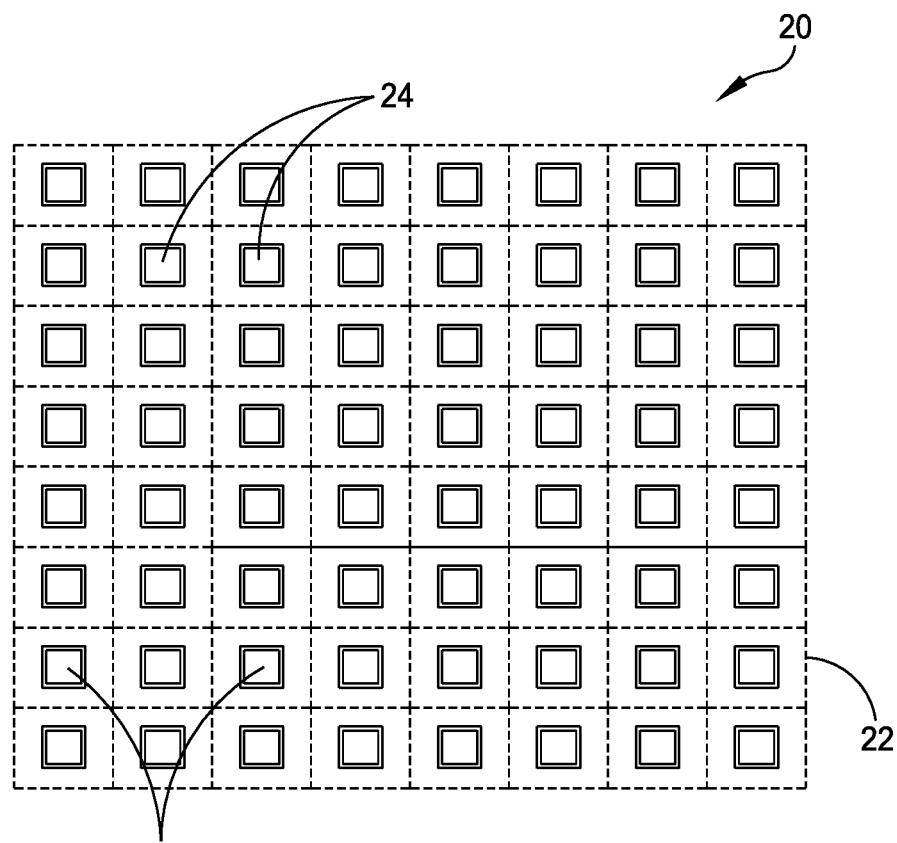
FIG. 3 is a plan view of the communications array shown in FIG. 2.

Referring to the drawings, and more particularly to FIGS. 2 and 3, a communications array of an embodiment of the present disclosure is generally indicated at 20. In one embodiment, the communications array 20 includes a support structure 22 fabricated from a printed circuit board (PCB) or similar dielectric material. Examples of support structures can include fiberglass, polytetrafluoroethylene (PTFE), or other dielectric materials typically used for circuit cards. While typically planar, rigid and rectilinear, the support structure can be conformal and/or flexible. The support structure may be monolithic or multilayer. The communications array 20 further includes an array of elements, each indicated at 24, including but not limited to radiators, beamformers, circuit layers, and/or micro-strip layers that may be formed using additive manufacturing techniques in accordance with example embodiments of the disclosure. In the illustrated embodiment, the communications array 20 is configured as an 8×8 array including 64 array elements 24. In some embodiments, the communications array 20 is square-shaped, and includes a length and width of approximately 1.69 inches. In some embodiments, each array element 24 includes an overall length and width of 0.210 inches, with the array element having a length and width of 0.90 inches.

For example, in one embodiment, the array element 24 may include a radiator manufactured using an additive manufacturing technology (AMT) manufacturing process. The support structure 22 may be configured to include a first dielectric substrate disposed over and bonded (or otherwise coupled) to a second dielectric substrate. A surface of the first substrate is provided having an electrically conductive material (e.g., copper or an equivalent conductive material) disposed thereover. An aperture antenna element (or more simply "aperture") having a square shape is milled into the surface of the first dielectric substrate to create the radiator. In a certain embodiment, the square shaped aperture is formed by an AMT milling operation which removes the conductive material from substrate surface to form the square shape aperture. In some embodiments, the conductive material is provided as copper having a thickness of 0.0007 inches (i.e., ½ once (oz) copper) is disposed over substrate surface. The particular aperture width is thus selected in accordance with a variety of factors including, but not limited to, the desired frequency of operation (or frequency bandwidth of operation), the thickness of substrates which provide the radiator and the particular shape of the aperture.

In another embodiment, the array element 24 may include a beamformer manufactured using an additive manufacturing technology (AMT) manufacturing process. The beamformer, which may be referred to in general as an electromagnetic circuit structure, may be manufactured using an additive manufacturing technology (AMT) manufacturing process. The beamformer may be fabricated to have multiple receptors and accordant output signal traces.

Figure 4:
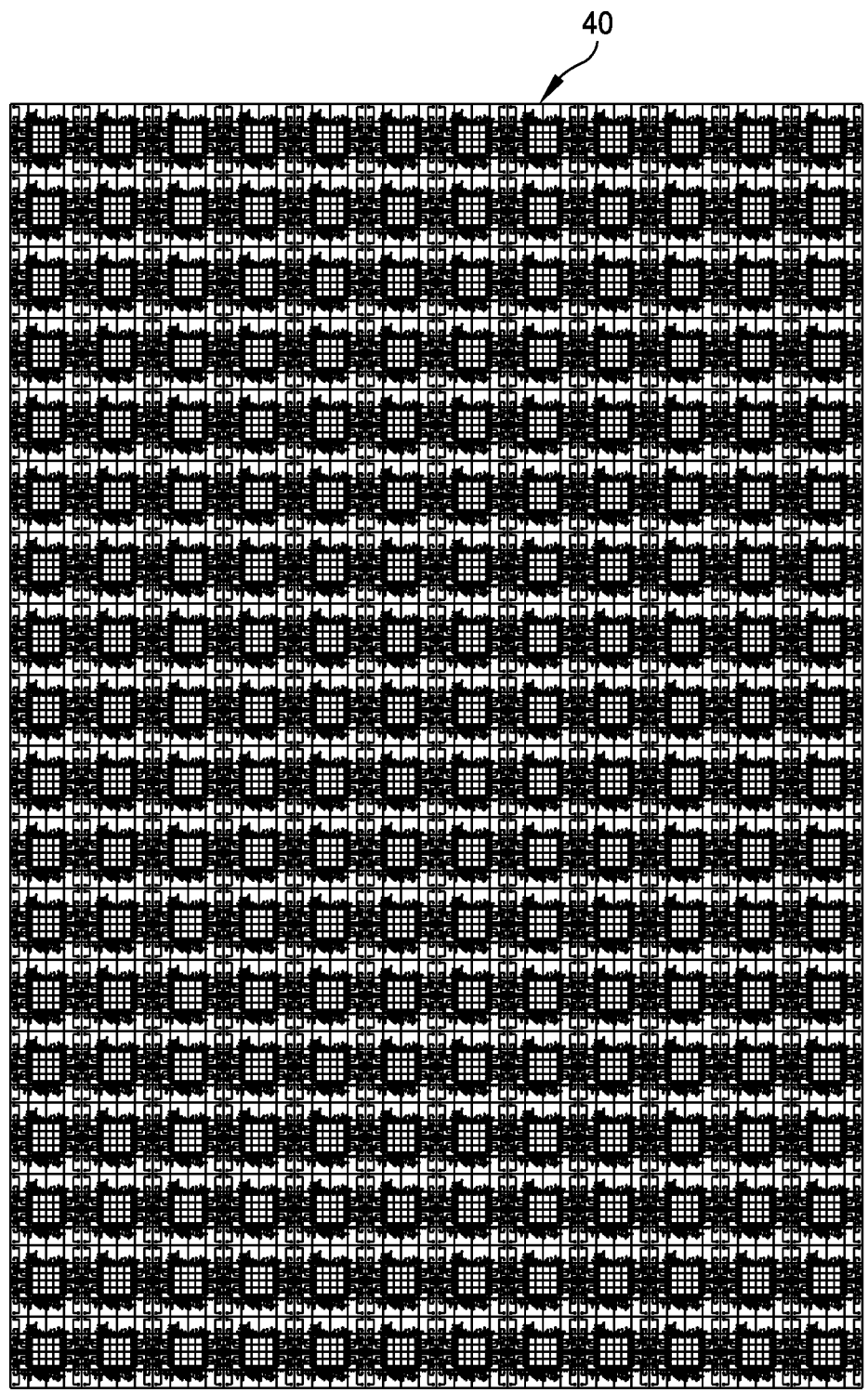
FIG. 4 is a plan view of a process panel used to process communications arrays.

Referring to FIG. 4, a process panel used to manufacture the communications array is generally indicated at 40. The process panel 40 is configured to facilitate the miniaturization, low cost, and rapid prototyping of communications arrays. By employing AMT technology, the communications array can achieve miniaturized feature sizes and low profiles for frequencies of 28+ GHz. Specifically, AMT reduces both array feature sizes, reduces fabrication cost for commercially viable phased arrays, provides milled and printed walls to provide isolation, allows array profile (thickness) to fit within platform constraints, and allows for patch radiator geometry with a wide bandwidth for an application. AMT further facilitates short cycle times for development and production, e.g., 5-week fabrication and assembly.

Figure 5:
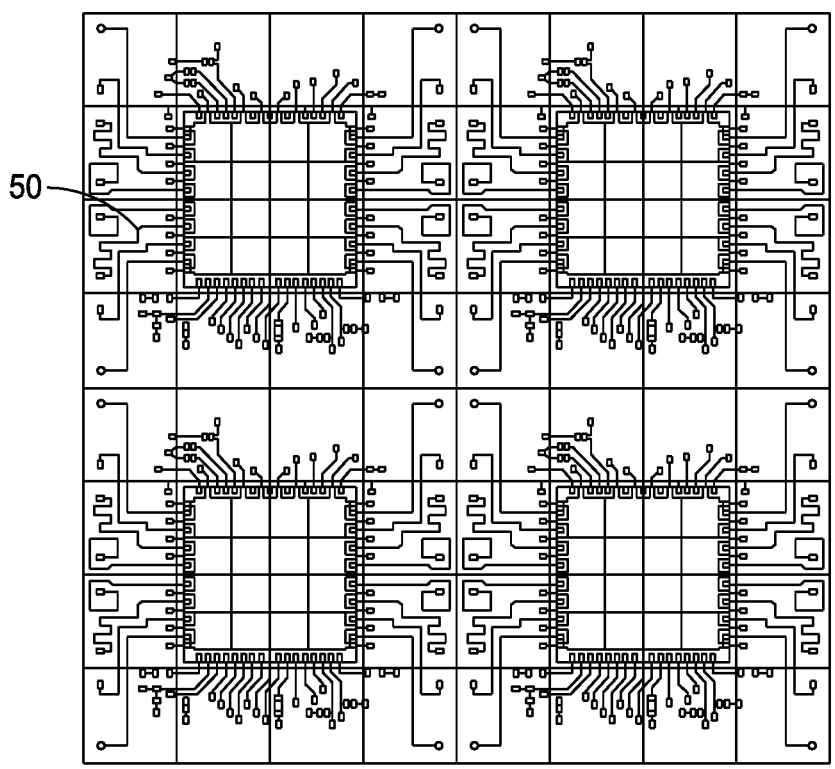
FIG. 5 is a plan view of a circuit layout of a communications array.

Referring to FIG. 5, which illustrates an example of an active circuit layout 50, the communications array 20 can be manufactured to achieve small size requirements that produces less than 12.5 W average dissipation. For example, the circuit layout 50 can achieve 2.0 mil trace widths that are presently unachievable using traditional PCB fabrication methods.

Figure 6:
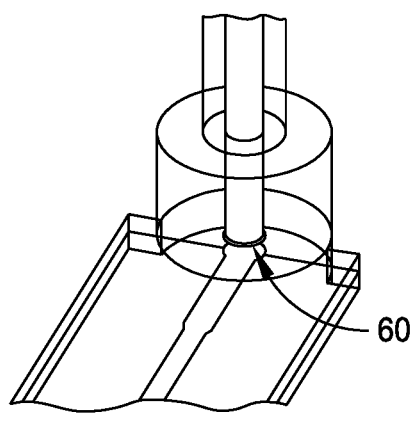
FIG. 6 is a perspective view of a copper vertical launch (CVL) provided in a communications array.

Referring to FIG. 6, the communications array can be manufactured to include a copper vertical launch (CVL), which is generally indicated at 60. Vertical interconnects or vias provide an electrical connection between layers in a physical electronic circuit that extends through the plane of one or more adjacent layers. When very small vias are required, the vias may be created by a process other than drilling, such as laser or plasma drilling. In certain embodiments, holes are drilled through the printed circuit board. Traditional methods involve making the holes conductive by electroplating or inserting hollow metal eyelets, to connect board layers. A CVL 60 can be created by staking copper wire into the holes. In some known embodiments, leads of through-hole components are inserted into the holes and soldered by a wave soldering process, for example. Presently, CVLs have replaced plated conductive vias.

Figure 7:
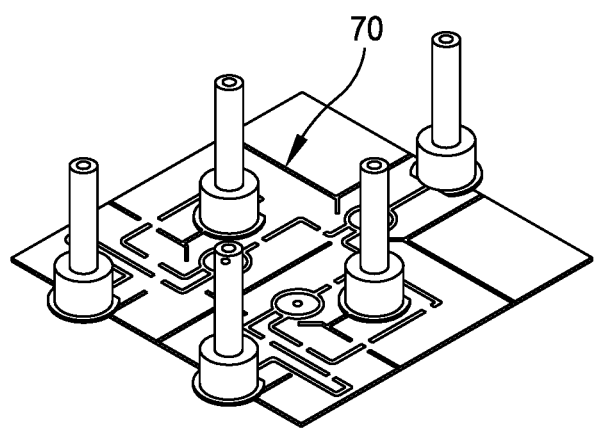
FIG. 7 is a perspective view of a Faraday wall provided in a communications array.

Referring to FIG. 7, the communications array can be manufactured to include an electromagnetic boundary, e.g., a Faraday wall, which is generally indicated at 70. Such an electromagnetic boundary 70 may enforce boundary conditions of an electromagnetic signal, e.g., to control or limit modes of a signal and/or characteristic impedance, or may provide isolation to confine signals to a region of an electromagnetic circuit. A Faraday wall or boundary is provided to replace via fences and to prevent a signal at one region of the circuit from affecting another region of the circuit, e.g., shielding. In one embodiment, the Faraday wall is a conductor providing an electromagnetic boundary "vertically" through one or more substrates. The Faraday wall may be fabricated by machining a trench through the substrate(s) to a ground plane and filling the trench with a conductive material, such as a conductive ink applied with additive manufacturing techniques, e.g., 3-D printing. The conductive ink, when set, may form a substantially electrically continuous conductor.

In some embodiments, the communications array can be configured to be lightweight, e.g., 0.7 oz. (20 g), have low dissipation and operate under DC power.

In some embodiments, the communications array can be configured as a single scanned beam, e.g., an RHCP polarized antenna.

In some embodiments, the communications array can be configured to achieve a 60° conical scan volume.

In some embodiments, the communications array provides a low cost, low dissipation, lightweight phased arrays to operate in the 5G communications market.

In some embodiments, the communications array is adaptable to a wide range of terrestrial uses and environments.

In some embodiments, the communications array is fabricated using AMT processes, including a robot-based CAD driven process.

In some embodiments, the circuit can be characterized before assembly into the communications array, allowing for higher overall yields and less scrap for defective parts.

As used herein, AMT refers to manufacturing processes, equipment and materials that are used to produce objects. For example, AMT can include 3D printing processes that are used to produce three-dimensional objects. Other processes can be implemented, such as jetting, fusion, extrusion, deposition and lamination processes. Factors determining which process to pursue include, but are not limited to speed of production, costs, use of material and geometric limitations.

Using AMT techniques removes most of the costly operations associated with conventional printed circuit board processes. In addition, build time and labor is reduced. Materials and processes associated with the radiator and beamformer designs of embodiments of the present disclosure are inexpensive when compared to using RF cabling.

AMT techniques enable printed Faraday walls that provide excellent isolation without plated vias.

Still other aspects, examples, and advantages are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment. Various aspects and embodiments described herein may include means for performing any of the described methods or functions.

Further advantages of system and methods described herein may be realized. For example, conventional PCB manufacturing may impose limitations on circuit feature sizes, such as the width of signal traces, in comparison with systems and method described herein, thus limiting the highest frequencies for which conventionally made electromagnetic circuits may be suitable. Further, substrate thicknesses impact characteristic impedance (e.g., due to the distance to ground planes disposed upon opposing surfaces) in relation to width of the traces. Accordingly, wider traces required by conventional PCB processes cause selection of thicker substrates (to maintain a particular characteristic impedance), thus limiting how thin the circuit can be manufactured. For example, general recommendations under conventional PCB manufacturing include total thicknesses of about 60 mil (0.060 inches). By comparison, electromagnetic circuits used in communications arrays in accord with aspects and embodiments described, using additive manufacturing techniques, can result in circuit boards having a low profile down to a thickness of about 10 mil or less, with signal line traces having widths of about 4.4 mil, or 2.7 mil, or less, and interconnect geometries substantially flush with a surface of the board.

Communications arrays and methods in accord with aspects and embodiments described herein, which use additive manufacturing techniques, allow for electrically continuous structures to connect ground planes. Accordingly, an electrically continuous structure is provided and disposed vertically through one or more substrates, (e.g., between opposing surfaces of the substrate) to form "Faraday walls" that confine electric fields. In various embodiments, such Faraday walls may electrically couple two or more ground planes. Further in various embodiments, such Faraday walls may confine and isolate electromagnetic fields form neighboring circuit components. In some embodiments, such Faraday walls may enforce a boundary condition to limit electromagnetic signals used in communications arrays to be locally transverse electric-magnetic (TEM) fields, e.g., limiting signal propagation to a TEM mode.

In various embodiments, various subtractive (milling, drilling), additive (printing, filling), and adherent (bonding) steps may be carried out, in various orders, with soldering and reflow operations as necessary, to form an electromagnetic circuit having one or any number of substrate layers, which may include one or more interconnect features as described herein.

A generalized method for making any of various electromagnetic circuits for communications arrays includes milling a conductive material disposed on a substrate to form circuit features, printing (or depositing, e.g., via 3-D printing, additive manufacturing techniques) additional circuit features, such as resistors formed of resistive ink, for example. The method may include depositing solder on any feature, as necessary, for example upon the terminal pad 352. The method may also include milling (or drilling) through substrate material (and/or conductive materials) to form openings, such as voids, vias or trenches, and includes depositing or printing (e.g., via 3-D printing, additive manufacturing techniques) conductive material (such as conductive ink or a wire conductor) into the voids/trenches, for example to form Faraday walls or vertical signal launches (e.g., copper). Any of these steps may be done in different orders, repeated, or omitted as necessary for a given circuit design, and may include interconnect structures as described herein. In some embodiments, multiple substrates may be involved in the manufacture of an electromagnetic circuit, and the method includes bonding further substrates as necessary, and further milling and filling operations.

Having described several aspects of at least one embodiment and a method for manufacturing an electromagnetic circuit for a communications array, the above descriptions may be employed to produce various electromagnetic circuits with an overall thickness of 10 mils (0.010 inches, 254 microns) or less, and may include signal traces, such as the traces as narrow as 4.4 mils (111.8 microns), 2.7 mils (68.6 microns), or even as narrow as 1.97 mills (50 microns), depending upon the tolerances and accuracy of various milling and additive manufacturing equipment used. Accordingly, electromagnetic circuits in accord with those described herein may be suitable for X-Band and higher frequencies, and in some cases up to 70 GHz or more.

Additionally, electromagnetic circuits for communications arrays in accord with those described herein may have a low enough profile (e.g., thickness of 10 mils or less), with accordant light weight, to be suitable for outer space applications, including folding structures to be deployed by unfolding when positioned in outer space.

Further, electromagnetic circuits manufactured in accord with methods described herein accommodate less expensive and faster prototyping, without the necessity for caustic chemicals, masking, etching, electroplating, etc. Simple substrates with pre-plated conductive material disposed on one or both surfaces (sides) may form the core starting material, and all elements of an electromagnetic circuit may be formed by milling (subtractive, drilling), filling (additive, printing of conductive and/or resistive inks), and bonding one or more substrates. Simple solder reflow operations and insertion of simple conductors (e.g., copper wire) are accommodated by methods and systems described herein.

Further, electromagnetic circuits manufactured in accord with methods described herein may accommodate deployment on, or designs calling for, non-planar surfaces. Thin, low-profile electromagnetic circuits, such as described herein and others, may be manufactured using mill, fill, and bond techniques as described herein to produce electromagnetic circuits having any desired contour, to adhere to a surface (such as a vehicle) or to support a complex array structure, for instance.

As disclosed herein, manufacturing is very repeatable and assembly in the field is simplified. AMT techniques reduce loss in stripline compared to coaxial cables. Subarray beamforming methods for randomized simultaneous Rx beams can be produced. Expandable design constructed from interlocking parts. Identical parts used for various input configurations. RF Beamformer circuit comprised of interlocking PWBs. Increased maximum circuit size. Epoxy-, glue- and lamination-free assembly procedure. Elimination of conventional RF connectors from assembly.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A communications array comprising:
    a support structure configured to support array elements, the support structure having a top planar surface; and
    a plurality of array elements supported by the support structure, each array element being fabricated from an advanced manufacturing techniques (AMT) process, each array element being spaced from one another a predefined distance to create an air gap between adjacent array elements, each array element having a top surface that is parallel to and spaced from the top planar surface of the support structure.

2. The communications array of claim 1, wherein the support structure is fabricated from a printed circuit board (PCB) or similar dielectric material.

3. The communications array of claim 1, wherein each array element of the plurality of array elements includes a radiator.

4. The communications array of claim 1, wherein the plurality of array elements includes an 8×8 array having 64 array elements.

5. The communications array of claim 1, wherein each array element is square-shaped.

6. The communications array of claim 5, wherein each array element includes an overall length and width of 0.210 inches, with the array element having a length and width of 0.90 inches.

7. The communications array of claim 1, wherein a process panel is used to manufacture the communications array.

8. The communications array of claim 1, further comprising a copper vertical launch (CVL).

9. The communications array of claim 8, wherein the CVL includes staking a copper wire into a hole formed in the support structure.

10. The communications array of claim 1, further comprising an electromagnetic boundary.

11. The communications array of claim 10, wherein the electromagnetic boundary includes machining a trench through the support structure and filling the trench with a conductive material.

12. The communications array of claim 11, wherein the conductive material includes a conductive ink applied by the AMT process.

13. The communications array of claim 1, wherein a weight of the communications array does not exceed 0.7 oz. (20 g).

* * * * *